United States Patent
Chen et al.

(10) Patent No.: US 7,646,635 B2
(45) Date of Patent: Jan. 12, 2010

(54) DATA READING CIRCUIT OF TOGGLE MAGNETIC MEMORY

(75) Inventors: Young-Shying Chen, Hsinchu (TW); Ding-Yeong Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 220 days.

(21) Appl. No.: 11/966,317

(22) Filed: Dec. 28, 2007

(65) Prior Publication Data

US 2009/0010088 A1 Jan. 8, 2009

(30) Foreign Application Priority Data

Jul. 2, 2007 (TW) .............. 96124052 A

(51) Int. Cl.
*G11C 11/14* (2006.01)
(52) U.S. Cl. .................. 365/171; 365/104; 365/149
(58) Field of Classification Search ............ 365/171, 365/104, 149, 173, 189.16, 189.17, 209, 365/189.05
See application file for complete search history.

(56) References Cited

U.S. PATENT DOCUMENTS

| | | |
|---|---|---|
| 6,426,907 B1 | 7/2002 | Hoenigschmid |
| 6,590,804 B1 * | 7/2003 | Perner .................. 365/158 |
| 6,909,631 B2 | 6/2005 | Durlam et al. |
| 2007/0211523 A1 * | 9/2007 | Kim ..................... 365/158 |

OTHER PUBLICATIONS

W. C. Jeong et al., A New Reference Signal Generation Method for MRAM Using a 90-Degree Rotated MTJ, IEEE Transactions on Magnetics, Jul. 2004, 2628-2630, vol. 40, No. 4.

J. Debrosse et al., A 16Mb MRAM Featuring Boostrapped Write Drivers, Symposium on VLSI Circuits Digest of Technical Papers, 2004, 454-457.

* cited by examiner

*Primary Examiner*—Dang T Nguyen
(74) *Attorney, Agent, or Firm*—Workman Nydegger

(57) ABSTRACT

A data reading circuit of a magnetic memory applicable for reading data of a magnetic memory includes a first transistor, a second transistor connected to the first transistor in series, a third transistor, a fourth transistor connected to the third transistor in series, a first transmission gate electrically connected to the first transistor, a second transmission gate electrically connected to the first and third transistors, a comparison circuit having two input ends respectively connected to the first transistor, and a storage capacitor having an end electrically connected to the first transistor and the other end connected to a power end.

10 Claims, 9 Drawing Sheets

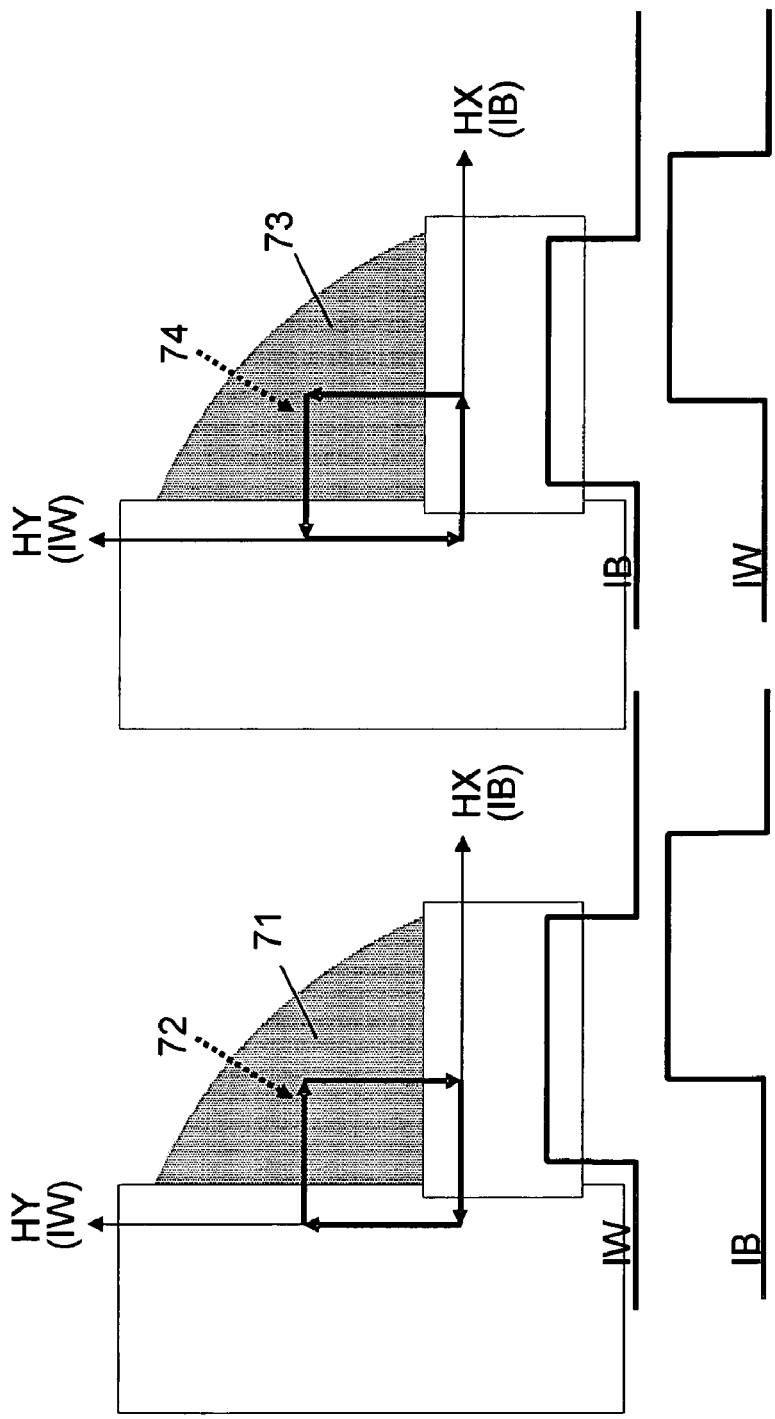

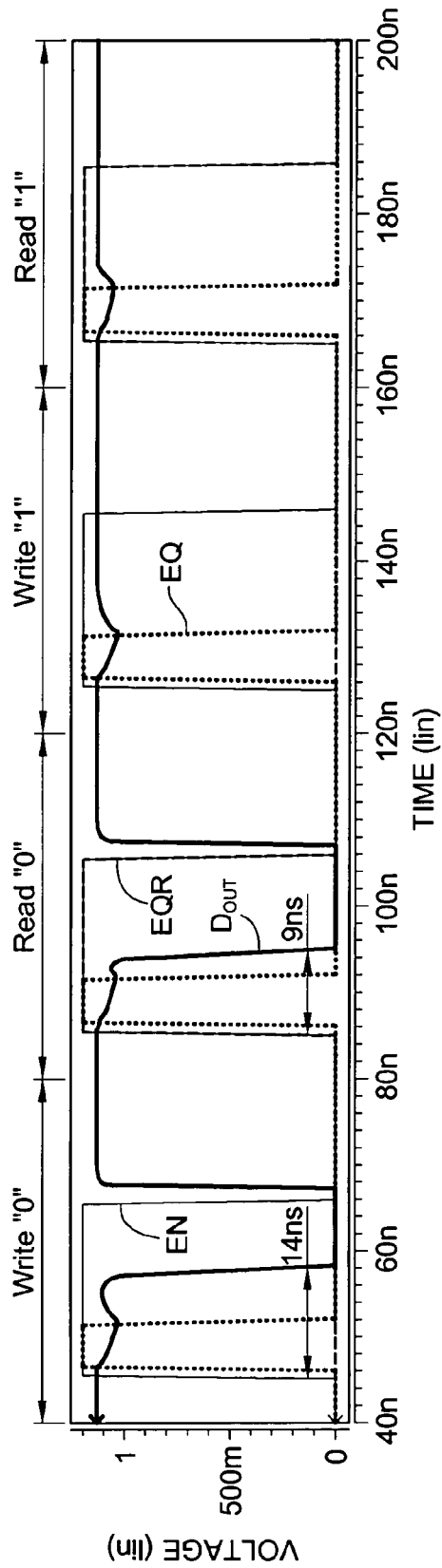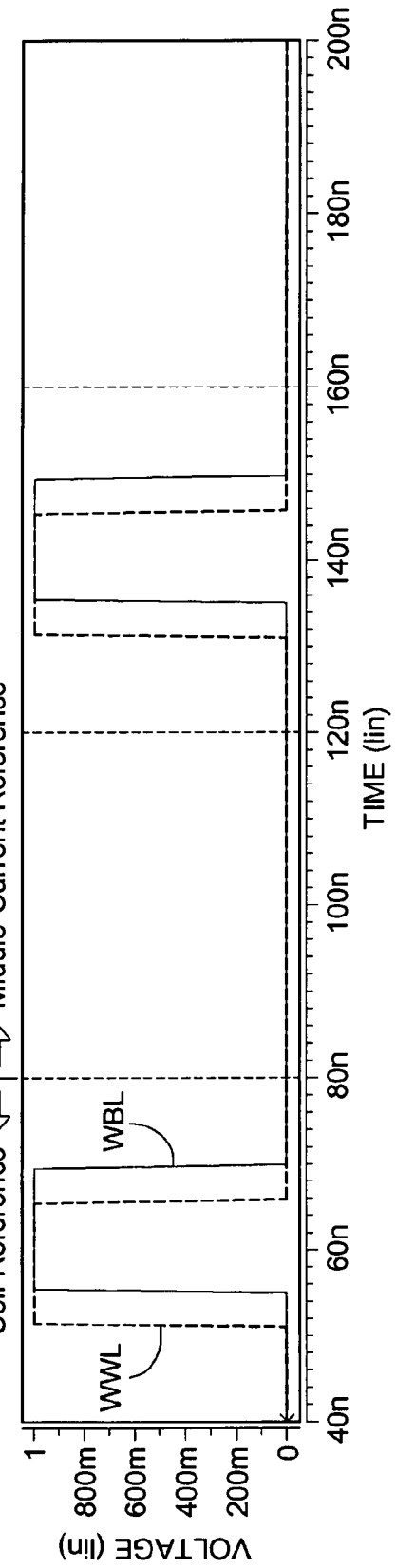
Fig. 7A
Fig. 7B

DATA READING CIRCUIT OF TOGGLE MAGNETIC MEMORY

CROSS-REFERENCE TO RELATED APPLICATIONS

This non-provisional application claims priority under 35 U.S.C. § 119(a) on Patent Application No(s). 096124052 filed in Taiwan, R.O.C. on Jul. 2, 2007, the entire contents of which are hereby incorporated by reference.

BACKGROUND OF THE INVENTION

1. Field of the Invention

The present invention relates to a data reading circuit of a magnetic memory, and more particularly to a data reading circuit capable of reading data of a toggle magnetic memory through a reading mode of combining a reading mode of self reference and middle-current reference bit.

2. Related Art

Magnetic random access memory (MRAM) belongs to a non-volatile memory that stores and records information according to resistance characteristics. The MRAM has the advantages of non-volatility, high density, high read/write speed, and radiation resistance. Main memory cells for the MRAM are magnetic memory elements disposed between a write bit line and a write word line. These memory elements are in a stacked structure of multi-layered magnetic metal materials including a soft magnetic layer, a tunnel barrier layer, a hard magnetic layer, and a nonmagnetic conductor layer, which are also referred to as magnetic tunnel junction (MTJ) elements.

Toggle MTJ elements have the advantages of broad operation scope and high thermal stability, which thus are suitable for being applied in embedded systems.

In an MTJ element, it determines to memorize the state "1" or "0" according to the fact that the magnetic moment of two ferromagnetic layers for sandwiching the tunnel barrier layer are in parallel or anti-parallel arrangement. The write data is selected by the intersection of the write bit line (WBL) and write word line (WWL), and a magnetization direction of the magnetic material for a memory layer is changed by the magnetic field generated by the current flowing in the WBL and WWL, such that the resistance is changed, and thereby the data are written.

Referring to FIG. 1A, a typical embodiment of the toggle MTJ element includes an anti-ferromagnetic layer 10, a pinned layer 20 formed on the anti-ferromagnetic layer 10, a tunnel barrier layer 30 formed on the pinned layer 20, and a free layer 40 formed on the tunnel barrier layer 30. The pinned layer 20 and the free layer 40 are both in synthetic anti-ferromagnetic configurations. An upper electrode 51 is formed on the free layer 40, and a lower electrode 52 is formed below the anti-ferromagnetic layer 10. The upper electrode 51 and the lower electrode 52 are connected to a metal wire, so as to form a path for reading data. The WBL and WWL are respectively above the upper electrode 51 and below the lower electrode 52, as shown in FIG. 1B, such that a magnetic field is generated when a write current flows there through. The upper electrode 51 is also connected to a read bit line RBL.

The anti-ferromagnetic layer 10 is made of an anti-ferromagnetic material, e.g., PtMn or IrMn. The pinned layer 20 formed above the anti-ferromagnetic layer 10 is a stack of more than one ferromagnetic layer. The pinned layer 20 shown in FIG. 1A is a three-layered synthetic anti-ferromagnetic fixed layer, which is formed by sequentially stacked ferromagnetic material, non-magnetic metal, and ferromagnetic material, among which the directions of magnetic moments for the two ferromagnetic layers are in the anti-parallel arrangement, for example, CoFe/Ru/CoFe, NiFe/RuNiFe, or CoFeB/Ru/CoFeB respectively. The material of the tunnel barrier layer 30 formed above the pinned layer 20 is, for example, AlOx or MgO. The free layer 40 formed above the tunnel barrier layer 30 may be a stack of more than one layer of ferromagnetic material, which may be NiFe, CoFe, or CoFeB.

In FIG. 1A, the pinned layer 20 includes three layers, i.e., magnetic layers 21 and 23 formed by a ferromagnetic material and an intermediate layer 22 formed by a non-magnetic metal. In addition, the free layer 40 also includes three layers, i.e., magnetic layers 41 and 43 formed by a ferromagnetic material and an intermediate layer 42 formed by a non-magnetic metal. The magnetic layers 41 and 43 in the free layer 40 has magnetic moments 61 and 62 respectively, which are in anti-parallel arrangement through the coupling of the intermediate layer 42. The magnetic layers 21 and 23 in the fixed layer 20 are also in anti-parallel arrangement. The directions of the magnetic moments for the magnetic fields 41 and 43 in the free layer 40 can rotate freely when a magnetic field is applied. However, the magnetization directions of the magnetic layers 21 and 23 in the pinned layer 20 do not rotate when a magnetic field is applied, so the fixed layer 20 functions as a reference layer.

When the data is written, a common method employs two current lines: the write bit line and the write word line, and the memory cells selected by the intersection of induced magnetic fields of the write bit line and the write word line has its resistance changed by changing the magnetization direction of the free layer 40. When the memorized data is read, a current is supplied and flows into the selected magnetic memory cells, so as to read the resistance of the memory cells to determine the digital value of the data.

Due to the anti-parallel coupling effect between the magnetic layers 41 and 43 of the free layer 40, the write operation areas and the writing mode for the toggle MTJ element are as shown in FIGS. 2A and 2B, which is referred to as a first-in-first-out mode. That is, the current conducted first is cut-off first. For example, in FIG. 2, a current IW of the WWL is conducted first before a current IB of the WBL is conducted, so the current IW of the WWL is cut-off first before the current IB of the WBL is cut-off. In FIG. 2B, the situation is just the opposite. The write operation areas 71 and 73 of the toggle MTJ element are as shown in the figures. When the current IW of the WWL is conducted first, the magnetic moments 61 and 62 of the magnetic layers 41 and 43 rotate in a clockwise direction 72; when the current IB of the WBL is conducted first, the magnetic moments 61 and 62 of the magnetic layers 41 and 43 rotate in an counterclockwise direction 74.

In order to improve the speed for the writing operation, U.S. Pat. No. 6,909,631 provides a wiggle waveform. However, such timing process consumes more power to read out data when the data is not written than that consumes by the conventional read-out circuits.

Another method to improve the operation speed utilizes a middle-current reference bit, for example, in U.S. Pat. No. 6,426,907, in which the design is formed by connecting two serially-connected high-resistance MTJ elements and two serially-connected low-resistance MTJ elements in parallel. Thus, the current flowing through a reference bit becomes the middle current. Moreover, A 16 *Mb MRAM Featuring Bootstrapped Write Drivers* published by J. DeBrosse in IEEE Symp. VLSI Tech., p. 454, 2004 proposes a design formed by connecting a high-resistance MTJ element and a low-resistance MTJ element in parallel, and the current sources connected in parallel are used to evenly divide the current flowing through the reference bit, so as to generate the middle current. *A new reference signal generation method for MRAM using a 90 degree rotated MTJ* published by W. C. Jeong in IEEE Trans. Magn. Vol. 40. p. 2628, 2004 also proposes a design that takes an MTJ element with magnetic moments of a free layer and a pinned layer being in an orthogonal arrangement as a reference bit, so as to solve the problem that the current flowing through the reference bit deviates from the middle current due to a MR % bias dependent ratio.

The reading circuits in the prior art adopt the design of a common reference bit, so it is not required to turn over the magnetic moment of the free layer for the MTJ element, which thus have advantages of high speed and power saving. However, due to the writing mode of the toggle magnetic memory, the turning-over mode of the magnetic moment of the free layer is a unidirectional cycle. Each time before the writing operation, the stored data must be read to be compared with the data to be written, and then, it is determined whether the subsequent data is to be written or not, so the Read-Before-Write (RBW) process limits the speed for the writing operation.

SUMMARY OF THE INVENTION

The present invention is directed to a data reading circuit of a magnetic memory.

The data reading circuit of a magnetic memory according to the present invention is used for reading data of a magnetic memory. The reading circuit includes a first transistor, a second transistor connected to the first transistor in series, a third transistor, a fourth transistor connected to the third transistor in series, a first transmission gate electrically connected to the first transistor, a second transmission gate electrically connected to the first and the third transistors, a comparison circuit having two input ends respectively connected to the first transistor, and a storage capacitor having one end electrically connected to the first transistor and the other end connected to a power node.

In the data reading circuit of a magnetic memory according to an embodiment of the present invention, the data-reading operation conducted when the data is not written maintains the high speed and power saving advantages as the conventional reading circuits. When the data is written, a data-reading operation before writing is incorporated into a writing operation by means of self reference to form a Read-Within-Write process, so as to obtain a higher writing speed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein:

FIGS. 2A and 2B are schematic views of an operation area and a write timing of the MRAM;

FIG. 7A to FIG. 7C show simulation results of the data reading circuit of the magnetic memory according to the present invention.

DETAILED DESCRIPTION OF THE INVENTION

Detailed features and advantages of the present invention are described in the embodiments below, and it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Figure 3:
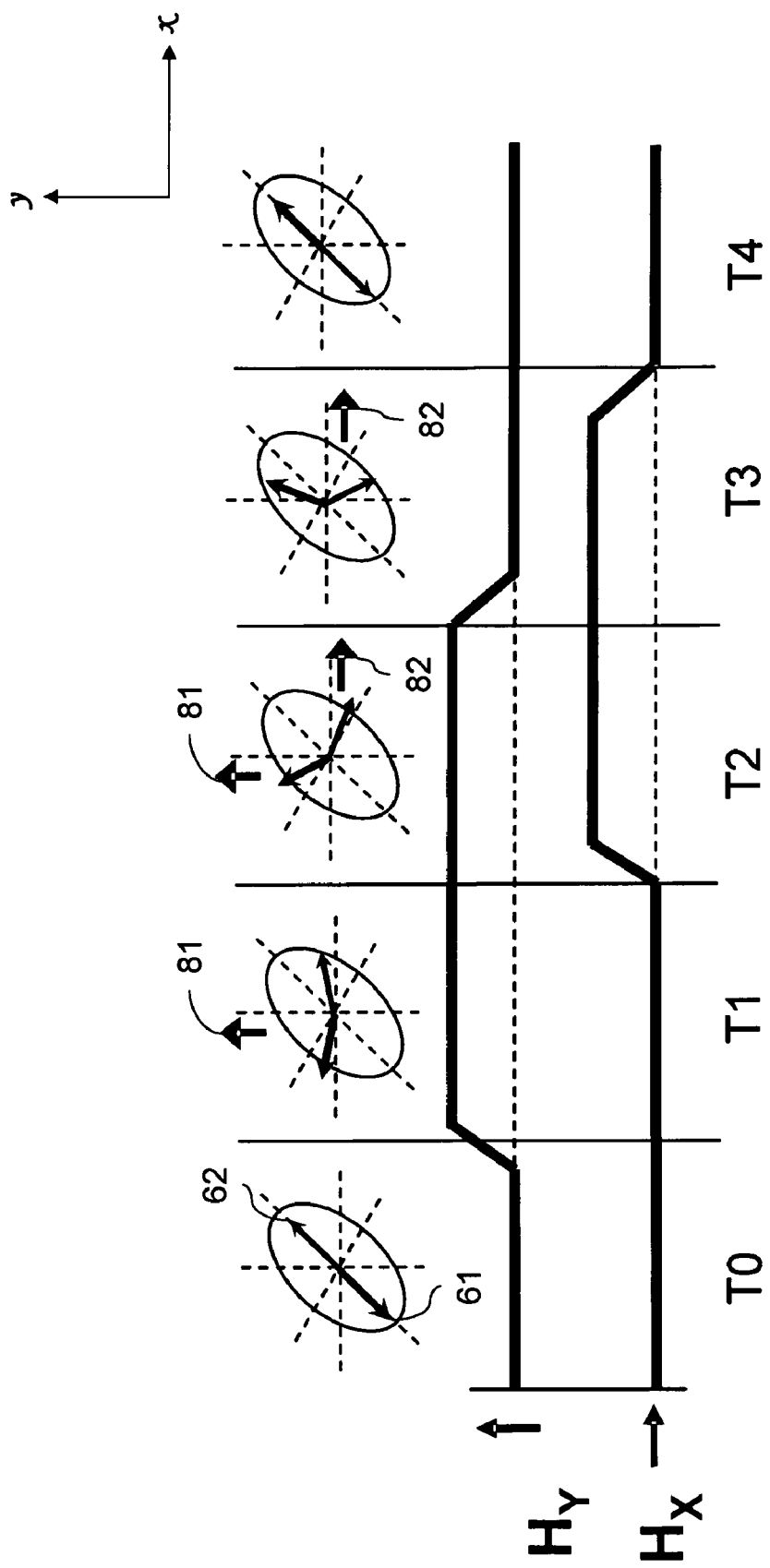
FIG. 3 is a schematic view of operations of a magnetic moment for a free layer of a toggle MJT element when the writing waveform is correct.

Firstly, the writing waveform for an MRAM is illustrated, which is helpful for describing the main technical features of the embodiment below. FIG. 3 shows a timing writing mode for a toggle MTJ element.

Referring to FIG. 3, at the time T0, the magnetic moments 61 and 62 are respectively aligned with a direction of an easy axis of the toggle MTJ, and they respectively form an angle of 45 degrees and an angle of 225 degrees with respect to a positive X-axis direction.

At the time T1, the write word current is conducted, which generates a magnetic field 81 in a positive Y-axis direction, such that the magnetic moments 61 and 62 begin to turn over. Anti-parallel exchange coupling between the magnetic layers 41 and 43 of the free layer 40 makes the magnetic moments 61 and 62 deviate by a small angle towards the direction of the magnetic field. Thus, a composite magnetic moment (not shown) of the magnetic moments 61 and 62 is aligned with the direction of the magnetic field 81, and rotates in the clockwise direction.

At the time T2, the write bit current is conducted, which generates a magnetic field 82 in the positive X-axis direction. Due to the magnetic field 81 in the positive Y-axis direction and the magnetic field 82 in the positive X-axis direction, the composite magnetic moment further rotates in the clockwise direction until it is substantially aligned with the direction of the anisotropy easy axis, and the direction of the easy axis is at an angle of 45 degrees with respect to the positive X-axis direction.

At the time T3, the write word current is cutoff. Thus, only the magnetic field 82 in the positive X-axis direction exists at the time T3, so the composite magnetic moment is aligned with the direction of the magnetic field 82. In this phase, the magnetic moments 61 and 62 have deviated over an anisotropy hard axis.

At the time T4, the write bit current is cutoff. Due to the anti-parallel exchange coupling between the magnetic layer 41 and the magnetic layer 43, the magnetic moments 61 and 62 are aligned with the anisotropy easy axis, and show an anti-parallel arrangement, so as to achieve a minimum energy state. Taking the magnetic moment 61 for example, at the time T4, the direction of the magnetic moment 61 is aligned with the anisotropy easy axis, and the angle is 45 degrees. Compared with the initial angle of 225 degrees for the magnetic moment 61 at the time T0, there is a difference of 180 degrees between the angle at the time T4 and the initial angle, i.e., the state of the magnetic moment 61 has been turned over. If the state of the magnetic moments 61 and 62 is defined as "1" at the time T0, the state of the magnetic moments 61 and 62 is defined as "0" at the time T4.

The above description mainly focuses on the clockwise rotation. Similarly, the write word current and the write bit current may also be conducted in an opposite direction, such that the magnetic moments 61 and 62 rotate in the counter-clockwise direction, so as to change the memory state.

In the timing sequence from the time T0 to T4, the write word current is conducted first before the write bit current is conducted, and the write word current is cutoff first before the write bit current is cutoff. Therefore, this time mode is referred to as the first-in-first-out mode.

Figure 4:
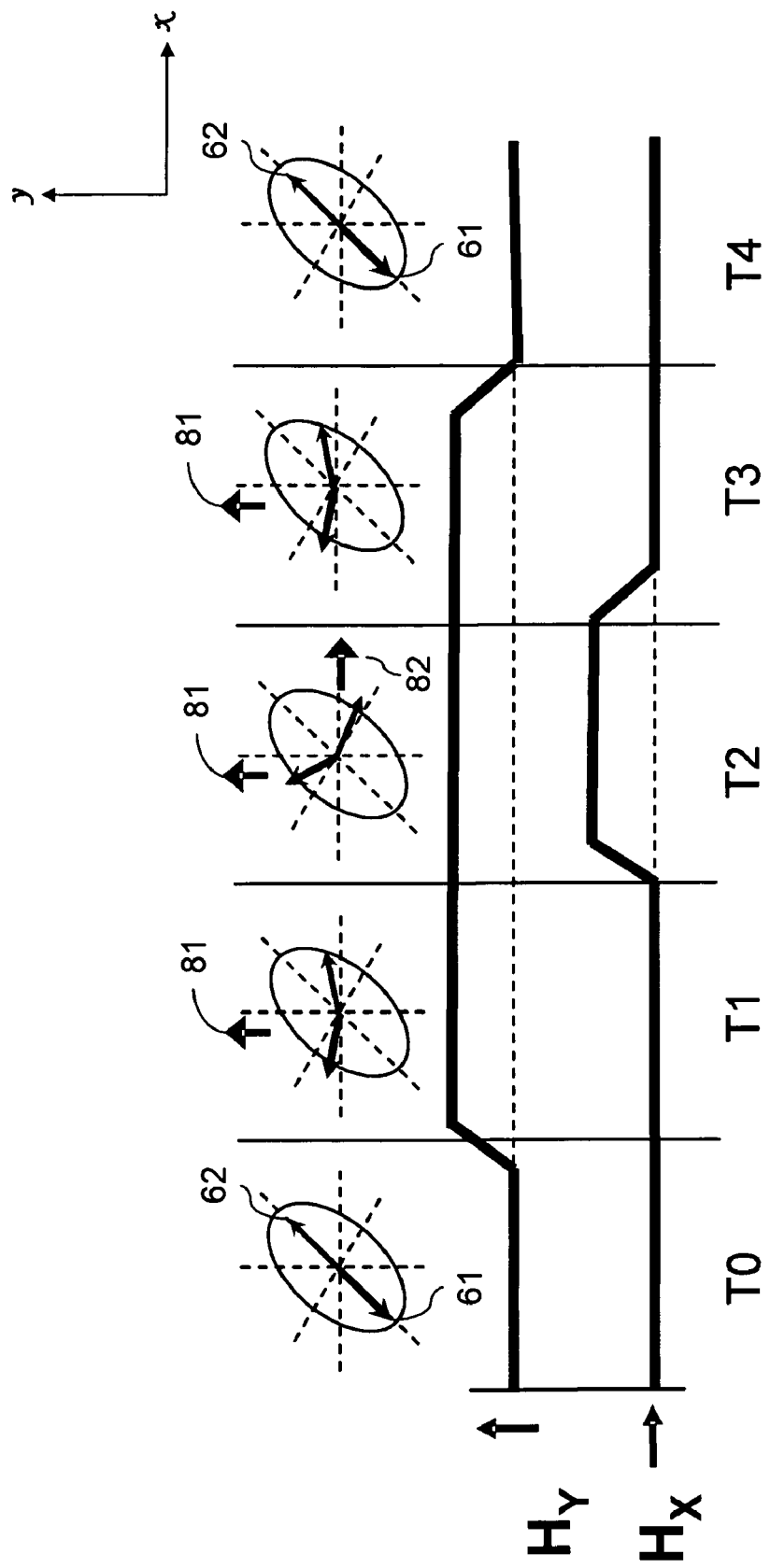
FIG. 4 is a schematic view of operations of the magnetic moment for the free layer of the toggle MJT element when the writing waveform is incorrect.

FIG. 4 shows another writing waveform for a toggle MTJ element.

Referring to FIG. 4, the timing between the time T0 and T3 is the same as that in FIG. 3, which thus is not described again here. At the time T3, the write word current is still conducted, and the write bit current is cutoff, such that only the magnetic field 81 in the positive Y-axis direction exists at the time T3, and the magnetic moments 61 and 62 rotate in the counter-clockwise direction to pass over the anisotropy hard axis again, and restore the deviation angle at the time T1. At the time T4, the write word current is cutoff. Due to the anti-parallel exchange coupling between the magnetic layer 41 and the magnetic layer 43, the magnetic moments 61 and 62 restore the initial directions.

Figure 1A:
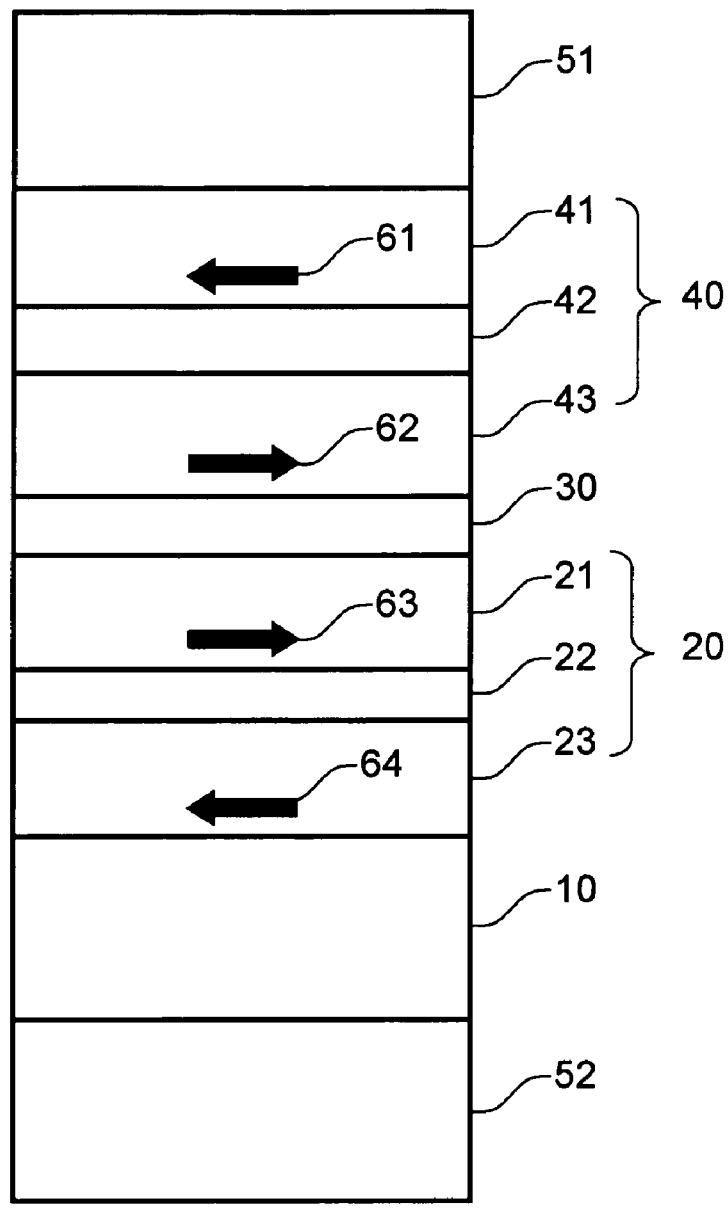
FIGS. 1A and 1B are schematic structural views of an MRAM.
Figure 1B:
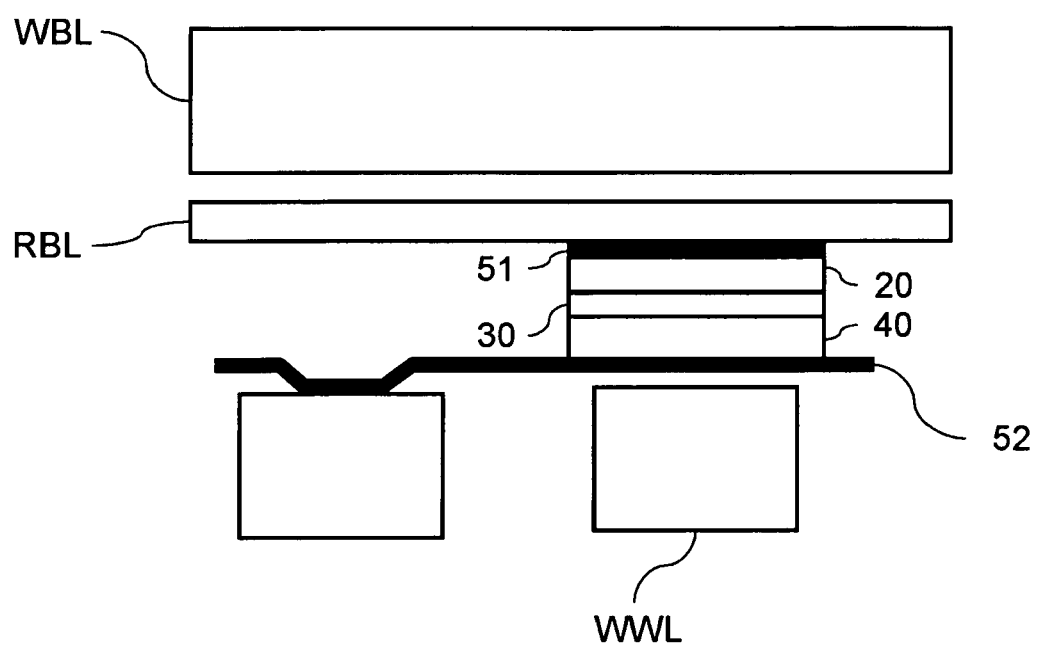

In the writing waveform of FIG. 3, the magnetic moment of the free layer may be turned over to another stable state direction, which indicates the operation of writing data. In the writing waveform of FIG. 4, the magnetic moment of the free layer turns to an intermediate state direction temporarily, and then restores the direction of the time T1 at the time T3, which indicates that the writing operation fails. It is known from the figures that, at the time T2, regardless of the waveforms shown in both FIGS. 3 and 4, the magnetic moment of the free layer will turn to the middle state direction. Therefore, the resistance change from the resistance of the magnetic moment of the free layer at the direction of the initial state to that at the middle state may be used for determining the data stored in the MTJ element, which is the reading mode of self reference. Under the architecture of separate writing and reading operations, the WBL and RBL are independent from each other, as shown in FIG. 1B of the prior art, so the resistance of the MTJ element can be read while data is written.

Figure 5:
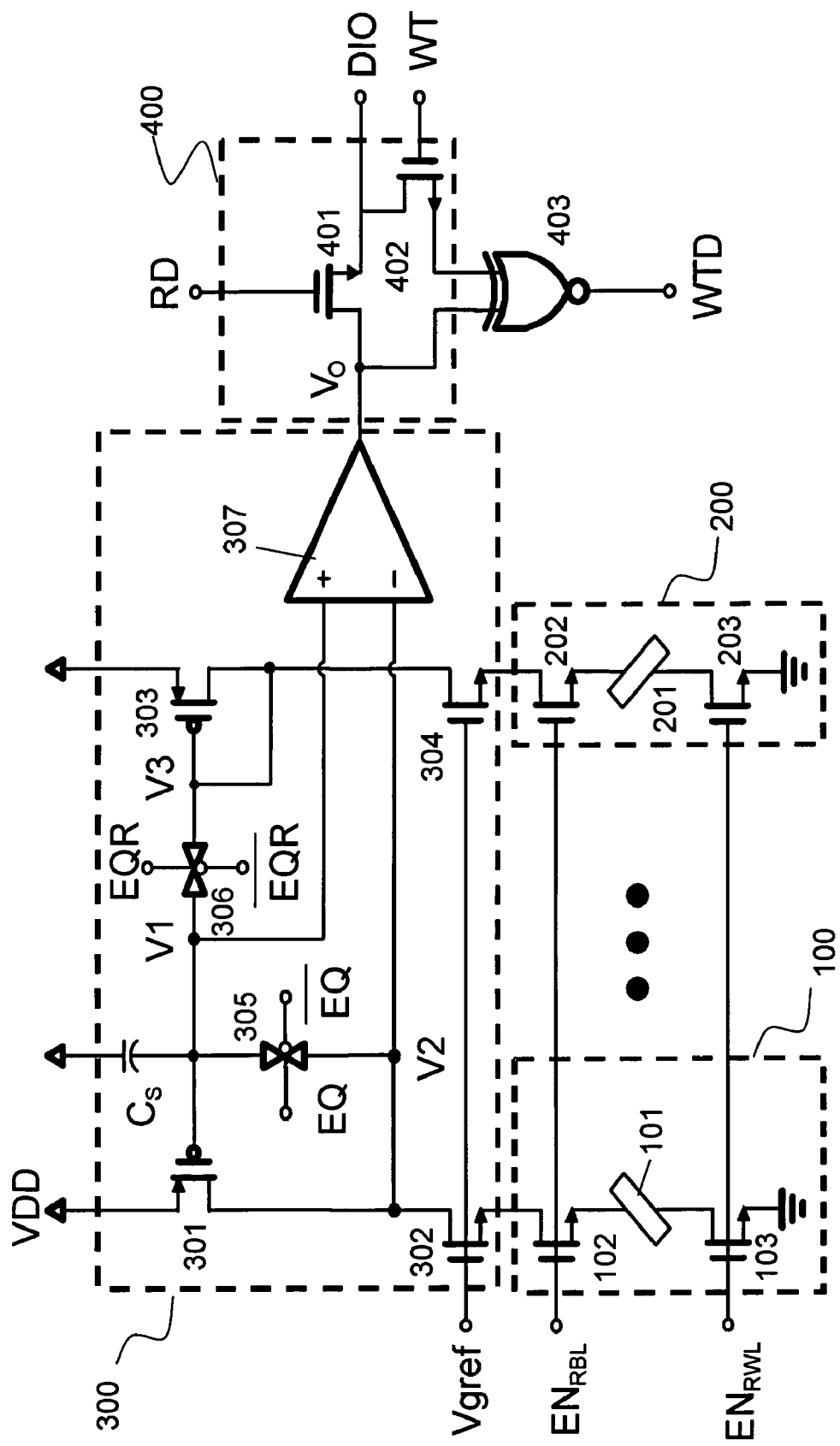
FIG. 5 shows a data reading circuit of a magnetic memory according to an embodiment of the present invention.

FIG. 5 shows a data reading circuit of a magnetic memory according to an embodiment of the present invention.

Referring to FIG. 5, the reading circuit 300 is used to read the data in a memory cell 100. The memory cell 100 includes an MTJ element 101, a first switch 102, and a second switch 103. A reference unit 200 includes a reference MTJ element 201, a third switch 202, and a fourth switch 203.

A magnetic memory formed by a plurality of memory cells 100 is disposed at the junction between a first wire and a second wire (not shown), e.g., a write bit line WBL and a write word line WWL. The MTJ element in the magnetic memory has an MTJ element, and the MTJ element at least includes a synthetic anti-ferromagnetic free layer, a tunnel barrier layer, and a synthetic anti-ferromagnetic fixed layer, and the memorized data is represented through a different resistance achieved depending upon the fact that the magnetic moment configurations of the two ferromagnetic layers for sandwiching the tunnel barrier layer are in the anti-parallel or parallel arrangement. An initial configuration is shown at an initial time.

Figure 6:
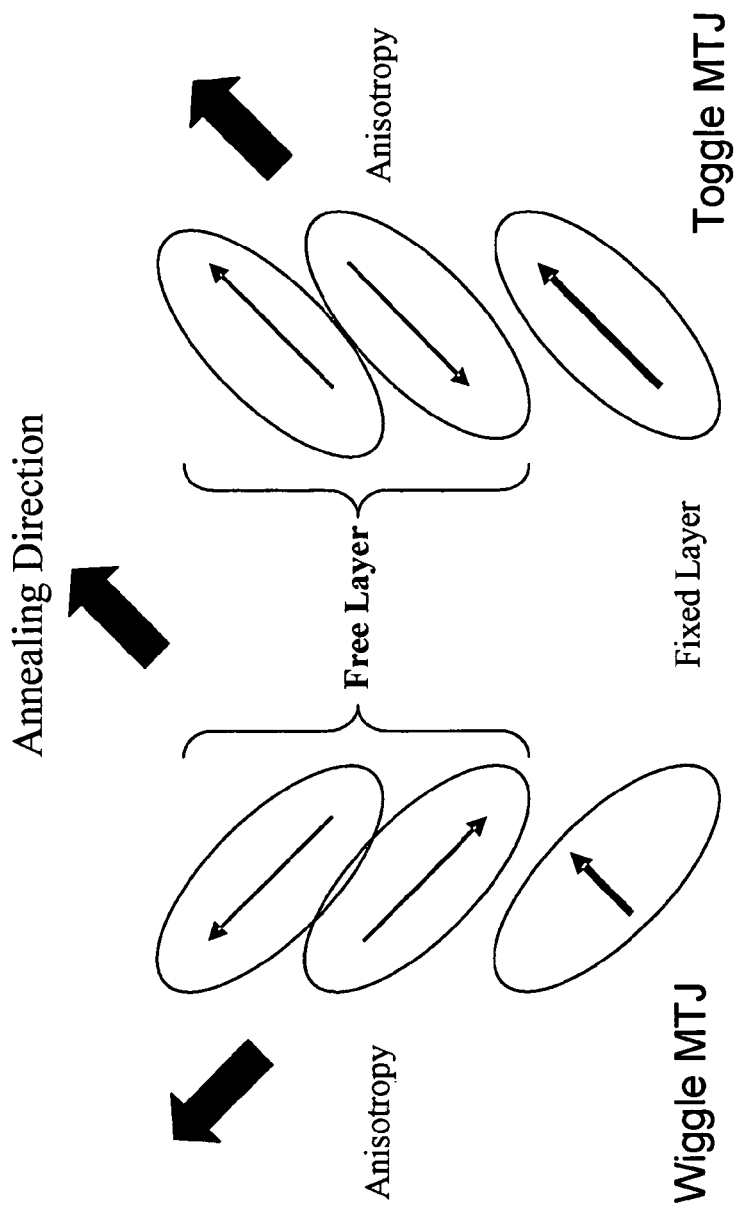
FIG. 6 is a schematic view of magnetizations of a magnetic memory in the present invention applied in a memory.

As shown in FIG. 6, under the architecture of separated reading and writing operations, the MTJ element 101 is a toggle MTJ element, in which the magnetic moment configuration of the free layer and that of the fixed layer are in parallel under the stable state. The reference MTJ element 201 is a wiggle element, in which the magnetic moment configuration of the free layer and that of the pinned layer are orthogonal under the stable state.

The reference MTJ element 201 serving as a reference bit has the same size as the MTJ element 101 of the memory cell. However, the shapes of the two elements horizontally mirror each other. After a magnetic thin film is etched and annealed, due to the shape anisotropy, the magnetic moment configuration of the free layer and that of the pinned layer for the reference MTJ element 201 are orthogonal under the stable state.

The selection of the memory cell 100 is determined by the first switch 102 and the second switch 103. In one embodiment, the first switch 102 and the second switch 103 are both nMOS. In the embodiment shown in the figures, a gate of the first switch 102 receives a bit-line enabling signal $EN_{RBL}$, and a gate of the second switch 103 receives a word-line enabling signal $EN_{RWL}$.

The selection of the reference MTJ element 201 is determined by the third switch 202 and the fourth switch 203. In one embodiment, the third switch 202 and the fourth switch 203 are both nMOS. In the embodiment shown in the figures, a gate of the third switch 202 receives a bit-line enabling signal $EN_{RBL}$, and a gate of the fourth switch 203 receives a word-line enabling signal $EN_{RWL}$.

The reading circuit 300 includes a first transistor 301, a second transistor 302, a third transistor 303, a fourth transistor 304, a first transmission gate 305, a second transmission gate 306, a comparison circuit 307, and a storage capacitor $C_S$.

The first transistor 301 is a pMOS, and the second transistor 302 is an nMOS. The first transistor 301 and the second transistor 302 are connected in series. The third transistor 303 is a pMOS, and the fourth transistor 304 is an nMOS. The third transistor 303 and the fourth transistor 304 are connected in series.

The first transmission gate 305 is connected between a gate and a drain of the first transistor 301. The second transmission gate 306 is connected between the gate of the first transistor 301 and the gate of the third transistor 303. One end of the storage capacitor $C_S$ is electrically connected to the gate of the first transistor 301, and the other end is electrically connected to a power VDD. The gate and drain of the first transistor 301 are electrically connected to the comparison circuit 307 respectively. An output end of the comparison circuit 307 is electrically connected to an output circuit 400. Input ends of the comparison circuit 307 are respectively connected to the gate and the drain of the first transistor 301.

The output circuit 400 receives an output signal Vo output from the reading circuit 300. The output circuit 400 has a fifth switch 401 and a sixth switch 402, which are respectively controlled by a read enabling signal RD and a write enabling signal WT. The fifth switch 401 and the sixth switch 402 may be NMOS. When the fifth switch 401 is turned on due to the read enabling signal RD, the output signal Vo is output as a data signal DIO from the fifth switch 401. When the data is to be written into the memory, the sixth switch 402 is turned on due to the write enabling signal WT.

One end of a control circuit 403 receives the output signal Vo, and the other end receives the write enabling signal WT transmitted from the sixth switch 402. In addition, the control circuit 403 performs logic operation on the output signal Vo and the write enabling signal WT, so as to output a write control signal WTD, and thus determining whether to write the data into the memory or not. In one embodiment, the control circuit may be a logic gate 403, e.g., an XNOR gate, for performing an XNOR logic operation.

The circuit shown in FIG. 5 may be applied to read out the data when no data is being written or applied to read out data when the data is being written.

Firstly, the process of reading data when no data is being written is illustrated. After the bit-line enabling signal $EN_{RBL}$ and the word-line enabling signal $EN_{RWL}$ are received, a second start signal EQR turns on the second transmission gate 306. At this time, nodes V3 and V1 are connected, so the data state in the reference MTJ element 201 is transmitted to the node V1 through the node V3, and the reference MTJ element 201 functions as a middle-current reference bit. Then, a first start signal EQ turns on the first transmission gate 305, so as to balance the voltage level. The first start signal EQ is turned off, so as to turn off the first transmission gate 305. The voltage of the node V3 keeps the first transistor 301 in the ON state. At this time, the data state of the MTJ element 101 may be obtained from the node V2. Finally, the comparison circuit 307 compares the voltages of the nodes V2 and V3, and outputs logic "0" or "1", so as to output the data memorized in the MTJ element 101.

Then, the process of reading data when some data is being written is illustrated.

After the bit-line enabling signal $EN_{RBL}$ and the word-line enabling signal $EN_{RWL}$ are received, the reading circuit 300 is turned on. At this time, the second transmission gate 306 is in the OFF state. At the initial time, the first start signal EQ balances the voltage level, so the first transmission gate 305 is turned on in response to the first start signal, so as to store the initial state voltage of the MTJ element 101 in the capacitor $C_S$.

At the first time T1, the first start signal EQ is turned off, so as to turn off the first transmission gate 305. At this time, the initial state voltage has already been stored in the storage capacitor $C_S$, which maintains the bias of the first transistor 301 and keeps the first transistor 301 in the ON state. Moreover, the first current of the first wire is conducted at the first time T1, and the second current of the second wire is conducted at the second time.

When a waveform comes to the second time T2 from the first time T1, the comparator 307 compares the voltages of the nodes V2 and V1, and outputs logic "0" or "1", so as to read the data stored in the MTJ element 101, and meanwhile the comparator outputs the output signal Vo.

When the sixth switch 402 is turned on due to the write enabling signal, the control circuit 403 performs the XNOR logic operation on the data to be written and the output signal Vo of the comparator 307, so as to output a write control signal WTD at the third time T3. When the write control signal WTD output from the control signal is to write, in response to the write control signal WTD, the first current of the first wire is cutoff at the third time and the second current of the second wire is cutoff at the fourth time. When the write control signal WTD output from the control signal is not to write, in response to the write control signal WTD is responded, the second current of the second wire is cutoff at the third time, and the first current of the first wire is cutoff at the fourth time.

Figure 7C:
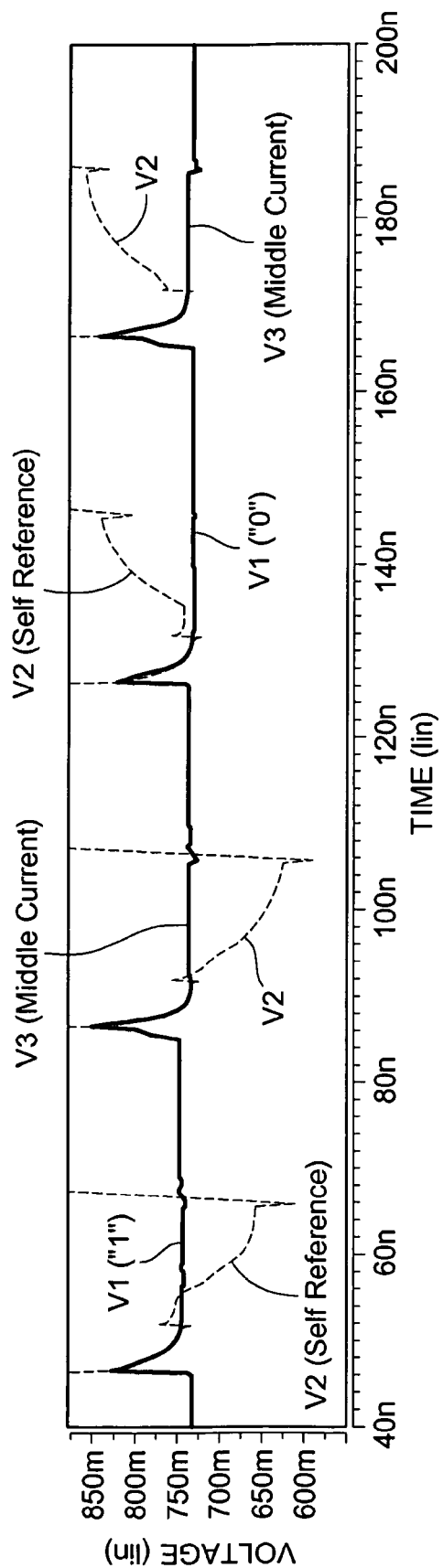

FIG. 7A to FIG. 7C show simulation results of the data reading circuit of the magnetic memory according to the present invention. The results are obtained through HSPICE simulation of performing successive data writing/reading operations twice, which are performed with the simulation circuit provided in the ROC Patent Application No. 96123875 and the 0.15 μm CMOS model manufactured by Taiwan Semiconductor Manufacturing Company Limited. As shown in the simulation results of FIG. 6, the time cost for reading data is 9 ns when no data is being written, so the objectives of high speed and power saving are achieved. When some data are being written, the time cost for reading data is about 14 ns. As this time period is incorporated in the writing process, the Read-Within-Write process can improve the speed for the writing operation.

No reading circuits with the middle-current reference bit and the self reference mode being combined has ever been disclosed in the prior art. However, in the present invention, the MTJ element with the magnetic moment configurations of the free layer and the pinned layer being orthogonal under the stable state is referred to a wiggle element. The magnetic moment configurations of the wiggle element are in the middle current state. During the data-reading operation conducted when no data is being written, the wiggle element having the characteristics of middle current is used to replace the common reference bit of conventional reading circuits, so as to solve the problem of MR % bias dependent ratio for the common reference bit, and to maintain the advantages of high speed and power saving as that of conventional reading circuits.

The reading circuit with the middle-current reference bit and self reference being combined according to the embodiment of the present invention is applicable for reading data of the toggle magnetic memory under the architecture of separated reading and writing operations. During the data-reading operation performed when no data is being written, the wiggle bit is taken as the middle-current reference bit, so as to maintain the advantages of high speed and power saving as the conventional reading circuits. During the data-reading operation performed when some data is being written, the data reading operation before writing is incorporated into the data writing operation by means of self reference, which is formed into a Read-Within-Write process, so as to obtain a higher writing speed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data reading circuit of a magnetic memory, applicable for reading data of a magnetic memory, wherein the magnetic memory is disposed at a junction between a first wire and a second wire, and has a magnetic tunnel junction (MTJ) element, the MTJ element at least includes a synthetic anti-ferromagnetic free layer, a tunnel barrier layer, and a synthetic anti-ferromagnetic pinned layer, and memorized data is represented through a different resistance achieved depending upon the fact that magnetic moment configurations of the two ferromagnetic layers for sandwiching the tunnel barrier layer are in anti-parallel or parallel arrangement, and an initial configuration is shown at an initial time, the data reading circuit comprising:

a first transistor;
a second transistor, connected to the first transistor in series;
a third transistor;
a fourth transistor, connected to the third transistor in series;
a first transmission gate, electrically connected to the first transistor;
a second transmission gate, electrically connected to the first and the third transistors;
a comparison circuit, having two input ends electrically connected to the first transistor respectively; and
a storage capacitor, having one end electrically connected to the first transistor and the other end connected to a power node;
wherein the second transmission gate is turned on in response to a second start signal, then the first transmission gate is turned on in response to a first start signal to balance a voltage level, and then the first transmission gate is turned off, and finally the comparison circuit compares voltages at the two input ends, so as to output logic 0 or logic 1.

2. The data reading circuit as claimed in claim 1, wherein the comparison circuit is a comparator, a gate of the first transistor is connected to one input end of the comparator, and a drain of the first transistor is connected to the other input end of the comparator.

3. A data reading circuit of a magnetic memory, applicable for reading data of a magnetic memory, wherein the magnetic memory is disposed at a junction between a first wire and a second wire, and has a magnetic tunnel junction (MTJ) element, the MTJ element at least includes a synthetic anti-ferromagnetic free layer, a tunnel barrier layer, and a synthetic anti-ferromagnetic pinned layer, memorized data is represented through a different resistance achieved depending upon the fact that magnetic moment configurations of the two ferromagnetic layers for sandwiching the tunnel barrier layer are in anti-parallel or parallel arrangement, and an initial configuration is shown at an initial time, the data reading circuit comprising:
a first transistor;
a second transistor, connected to the first transistor in series;
a third transistor;
a fourth transistor, connected to the third transistor in series;
a first transmission gate, electrically connected to the first transistor;
a second transmission gate, electrically connected to the first and the second transistors;
a comparison circuit, having two input ends electrically connected to the first transistor respectively;
a storage capacitor, having one end electrically connected to the first transistor and the other end connected to a power node; and
a control circuit, connected to the comparison circuit;
wherein the first transmission gate is turned on in response to a first start signal at an initial time, so as to store an initial state voltage in the storage capacitor;
the transmission gate is turned off and a first current of the first wire is conducted at a first time;
a second current flowing through the second wire is conducted at a second time, the comparison circuit outputs comparison results of voltages at the two input ends, and the control circuit outputs a write control signal in response to the output results of the comparison circuit and a data to be written;
the first current of the first wire is cutoff or the second current of the second wire is cutoff in response to the write control signal at a third time; and
the second current of the second wire is cutoff or the first current of the first wire is cutoff at a fourth time.

4. The data reading circuit as claimed in claim 3, wherein the comparison circuit is a comparator, a gate of the first transistor is connected to one input end of the comparator, and a drain of the first transistor is connected to the other input end of the comparator.

5. The data reading circuit as claimed in claim 3, wherein the control circuit is a logic gate.

6. The data reading circuit as claimed in claim 5, wherein the logic gate is an XNOR gate.

7. A magnetic memory, disposed at a junction between a first wire and a second wire, comprising:
a MTJ element, at least having a synthetic anti-ferromagnetic free layer, a tunnel barrier layer, and a synthetic anti-ferromagnetic pinned layer, wherein memorized data is represented through a different resistance achieved depending upon the fact that magnetic moment configurations of the two ferromagnetic layers for sandwiching the tunnel barrier layer are in anti-parallel or parallel arrangement, and an initial configuration is shown at an initial time;
a reference MTJ element, at least having a synthetic anti-ferromagnetic free layer, a tunnel barrier layer, and a synthetic anti-ferromagnetic pinned layer, wherein magnetic moment of the free layer and magnetic moment of the pinned layer are orthogonal in a stable state;
a data reading circuit, for reading data of the MTJ element; and
a control circuit, connected to the reading circuit, for outputting a write control signal in response to a write control signal and the data read by the reading circuit;
wherein a first current of the first wire is conducted at a first time, a second current flowing through the second wire is conducted at a second time, when the write control signal is to write, the first current of the first wire is cutoff at a third time and the second current of the second wire is cutoff at a fourth time, when the write control signal is not to write, the second current of the second wire is cutoff and the first current of the first wire is cutoff at a third time.

8. The magnetic memory as claimed in claim 7, wherein the data reading circuit comprising:
a first transistor;
a second transistor, connected to the first transistor in series;
a third transistor;
a fourth transistor, connected to the third transistor in series;
a first transmission gate, electrically connected to the first transistor;
a second transmission gate, electrically connected to the first and second transistors;
a comparison circuit, having two input ends electrically connected to the first transistor respectively; and
a storage capacitor, having one end electrically connected to the first transistor and the other end connected to a power end.

9. The magnetic memory as claimed in claim 7, wherein the control circuit is a logic gate.

10. The magnetic memory as claimed in claim 9, wherein the logic gate is an XNOR gate.

* * * * *